US 6,819,133 B1

(12) United States Patent
Kliesner et al.

(10) Patent No.: US 6,819,133 B1
(45) Date of Patent: Nov. 16, 2004

(54) SYSTEM AND METHOD FOR PROTECTING CONFIGURATION DATA FOR A PROGRAMMABLE EXECUTION UNIT

(75) Inventors: Matthew A. Kliesner, Madison, AL (US); Timothy G. Mester, Madison, AL (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 10/613,384

(22) Filed: Jul. 3, 2003

(51) Int. Cl.[7] .............................................. H03K 19/173
(52) U.S. Cl. ............................. 326/8; 326/38; 326/326; 326/41
(58) Field of Search ................. 326/8, 37–41; 713/1, 2, 10

(56) References Cited

U.S. PATENT DOCUMENTS

| 5,195,130 A | * | 3/1993 | Weiss et al. ............. 379/93.19 |
| 5,737,631 A | | 4/1998 | Trimberger ............ 395/800.37 |
| 5,745,734 A | * | 4/1998 | Craft et al. ................... 716/16 |
| 6,311,316 B1 | * | 10/2001 | Huggins et al. .............. 716/12 |

* cited by examiner

*Primary Examiner*—Don Le
(74) *Attorney, Agent, or Firm*—Thomas, Kayden, Horstemeyer & Risley, L.L.P.

(57) ABSTRACT

A system for protecting configuration data of a programmable execution unit (PEU) comprises a programmable array and programming logic. The programming logic is configured to receive configuration data and to program the programmable array, based on the configuration data, such that the programmable array comprises functional logic and activation logic. The activation logic is configured to enable the functional logic upon detection of an activation key.

21 Claims, 4 Drawing Sheets

SYSTEM AND METHOD FOR PROTECTING CONFIGURATION DATA FOR A PROGRAMMABLE EXECUTION UNIT

BACKGROUND

A programmable execution unit (PEU) typically refers to an integrated circuit (IC) that can be programmed to perform specified functions to provide specialized functionality to a variety of devices. PEUs are often used in digital signal processing devices, such as modems and video recorders, for example. There are various types of PEU's, such as, for example, a Programmable Read-Only Memory (PROM), a programmable logic array (PLA), a programmable array logic (PAL), a generic array logic (GAL), and a field-programmable gate array (FPGA).

A PEU is usually comprised of programmable logic elements, such as arrays of logic gates, which can be manipulated such that the PEU performs particular functions. In this regard, a system designer typically manipulates the gates within a PEU by implementing a logic design with a device programmer that blows fuses on the PEU to control the architecture and functionality of the logic gates.

In order for a system designer to program a PEU, the designer oftentimes uses placement and routing software (P&R software) for creating the logic design to be implemented via the PEU. The P&R software usually comprises a user-friendly graphical interface that allows simple and efficient programming of the PEU. Once the logic design has been defined, the P&R software creates a bit stream, representative of the logic design created by the system designer via the graphical user interface. This bit stream is then transmitted to a PEU, for example an FPGA, and logic resident on the PEU programs the PEU based on the received bit stream.

Typically, the bit stream is transmitted to the PEU via an observable channel, such as for example, a system on chip (SoC) bus. As such, it is possible to siphon the bit stream from the observable channel and use the bit stream to program unauthorized PEUs. Utilizing such techniques, it is possible for competitors or unauthorized users to effectively steal the logic design created by the system designer and to illegally program a large number of PEUs with the stolen logic design.

SUMMARY

Generally, embodiments of the present invention provide systems and methods for protecting configuration data of a programmable execution unit (PEU).

One embodiment of a system in accordance with the present invention comprises a programmable array and programming logic. The programming logic is configured to receive configuration data and to program the programmable array, based on the configuration data, such that the programmable array comprises functional logic and activation logic. The activation logic is configured to enable the functional logic upon detection of an activation key.

One embodiment of a method in accordance with the present invention comprises the steps of: receiving configuration data; programming a PEU, based on the configuration data, such that the PEU comprises functional logic and activation logic, and enabling the functional logic upon detection of an activation key by the activation logic.

BRIEF DESCRIPTION OF THE DRAWINGS

The invention can be better understood with reference to the following drawings. Furthermore, like reference numerals designate corresponding parts throughout the several views.

DETAILED DESCRIPTION

In general, the present invention generally pertains to systems and methods for protecting programming information defined by a bit stream transmitted to a programmable execution unit ("PEU") via an observable channel. A system in accordance with an exemplary embodiment helps to prevent the bit stream that is being transmitted over the observable channel to one PEU from being siphoned and then used to illegally program another PEU. Note that a bit stream preferably refers to binary data representing a flow of information transferred through a given medium, and the binary data transmitted to the PEU in a preferred embodiment represents configuration data that is used by the PEU's programming logic to configure the logic elements within the PEU's programmable array.

Note that, as described herein, the term "PEUL" can comprise any type of logic array, such as, for example, a PROM, a PLA, a PAL, a GAL, an FPGA, etc. For purposes of illustration, an exemplary embodiment of a PEU of the present invention shall be discussed hereafter as comprising an FPGA.

Figure 1:
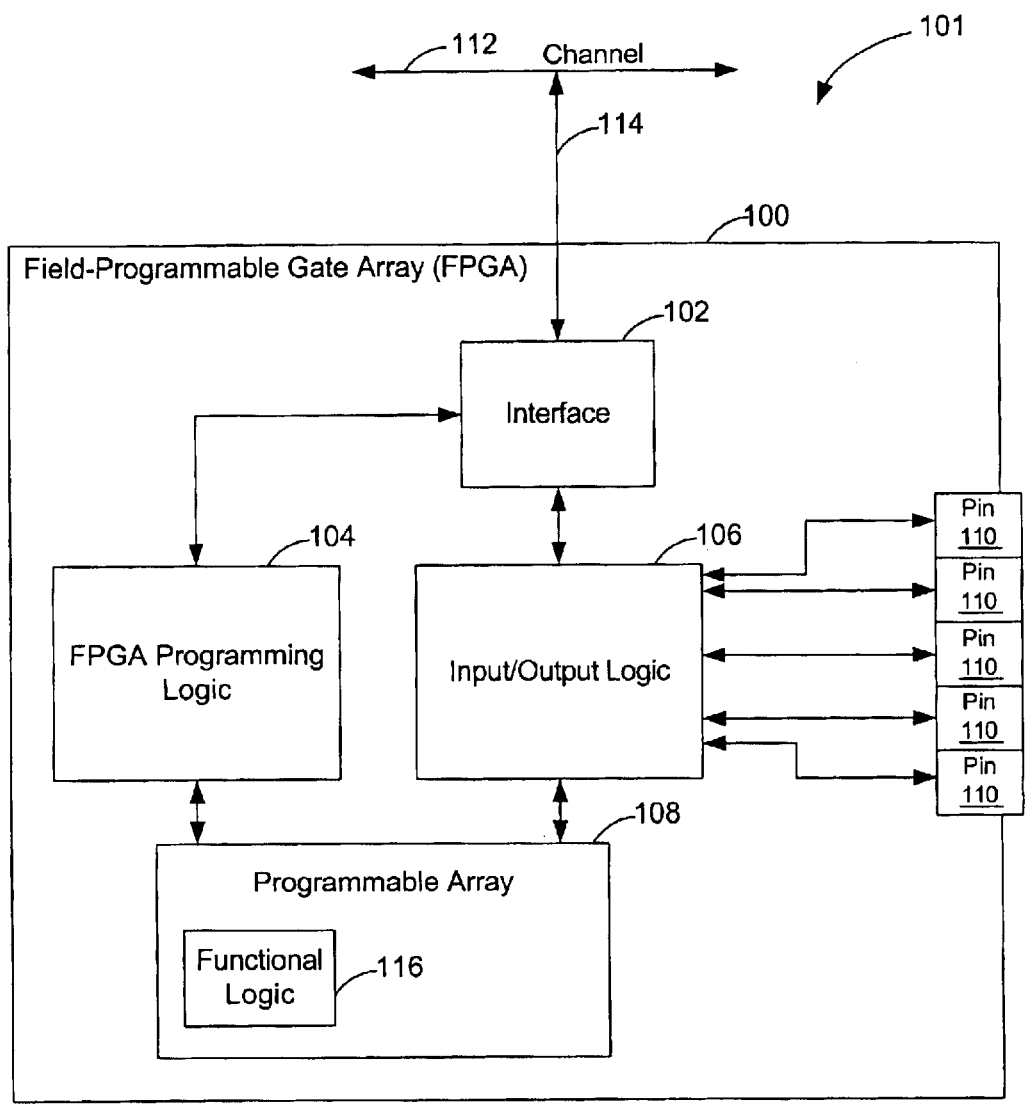
FIG. 1 is a block diagram illustrating a conventional programmable execution unit (PEU).

A conventional PEU 101 is illustrated in FIG. 1. The PEU 101 comprises an FPGA 100 that may receive configuration data and/or other types of data from an observable channel 112. As shown by FIG. 1, the FPGA 100 comprises an interface 102, input/output (I/O) logic 106, FPGA programming logic 104, and a programmable array 108. The interface 102 is communicatively connected via connection 114 to a channel 112. The FPGA 100 is preferably implanted in an integrated circuit (IC) chip (not shown). Note that the channel 112 may reside on the same IC chip as the FPGA 100 and/or may reside external to the IC chip of the FPGA 100. The channel 112 may comprise any type of a known or future-developed bus, such as, for example, a peripheral component interconnect bus (PCI bus). Note that a channel refers to a collection of one or more conductive wires, traces, or connections that conductively interconnect components of an electronic system, such as, for example, internal computer components or components on a printed circuit board (PCB).

To program the FPGA 100, configuration data is downloaded to the FPGA 100 and is used by resident programming logic 104 to configure the FPGA 100. Based on this data, the configuration of the FPGA 100 is controlled such that the FPGA 100 defines a circuit for performing a desired function. Note that the configuration data may be transmitted as an unencrypted bit stream from non-volatile memory (not shown in FIG. 1), such as PROM, to the FPGA 100. In this regard, a system controller, which can reside either internal or external to the FPGA 100, may retrieve the configuration data from PROM and transmit this data over channel 112 to interface 102.

The FPGA programming logic 104 then manipulates the configuration of logical elements (e.g., fuses, switches, transistors, logic gates, etc.) within the programmable array 108 based on the configuration data, such that the programmable array 108 defines functional logic 116 for performing a desired function. As an example, the FPGA programming logic 104 may manipulate switches and/or blow fuses in order to control the inputs and outputs of the logic gates within the programming array 108 such that the functional logic 116 is configured to perform the desired function. Note that the functional logic 116 represents a programmed configuration or circuit of logical elements within the programmable array 108 manipulated by FPGA programming logic 104.

In addition to logical elements, the programmable array 108 of the conventional FPGA 100 is typically comprised of a plurality of I/O elements that connect the logical elements within the array to the I/O logic 106. The I/O logic 106 then in turn connects the I/O elements with either the channel 112 via the interface 102 or external pins 110 to effectuate runtime transmission of signals to other components external to the FPGA 100.

Figure 2:
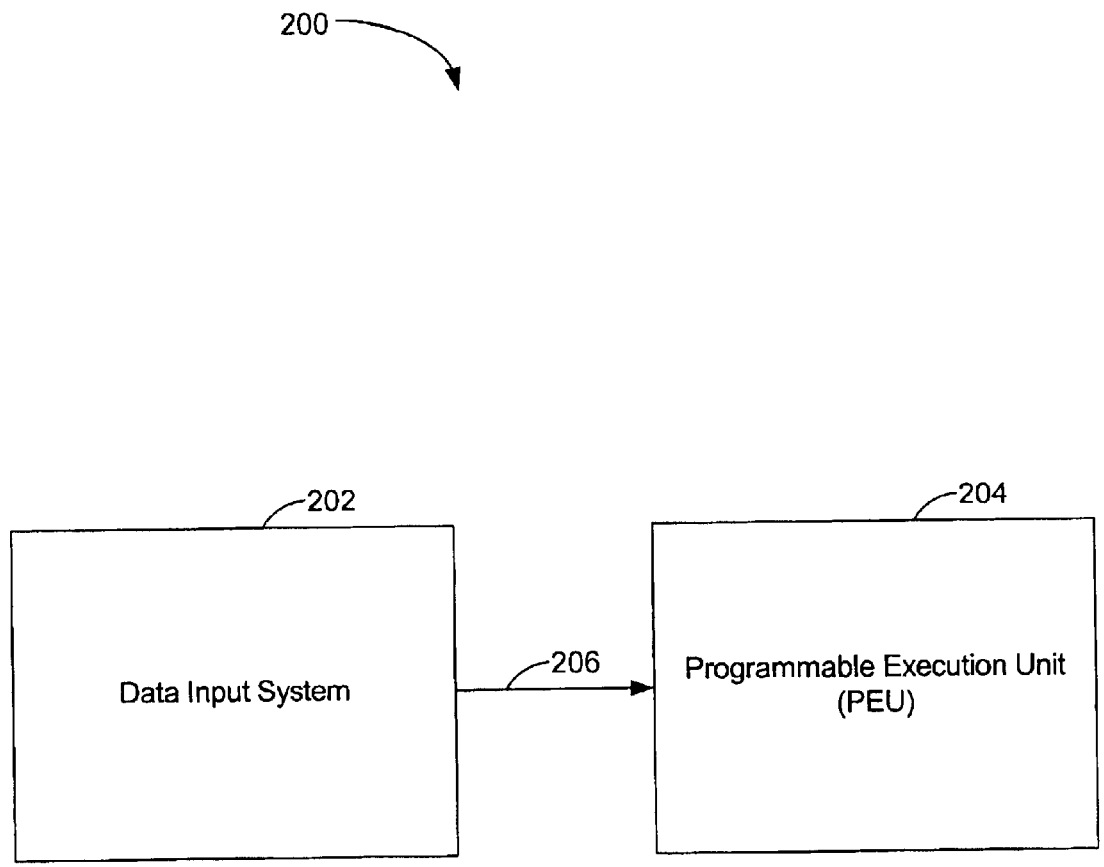
FIG. 2 is a block diagram illustrating an exemplary embodiment of a PEU system of the present invention.

FIG. 2 illustrates an exemplary PEU system 200, which comprises a data input system 202 and a PEU 204. The data input system 202 transmits, via a channel 206, configuration data for configuring the PEU 204, as described herein with reference to FIG. 1. However, the configuration data transmitted by the data input system 202 of FIG. 2 further configures the PEU 204 to await activation data before performing its designated function. After the PEU 204 has completed configuration corresponding to the configuration data provided, the data input system 202 transmits activation data, which triggers the PEU 204 to enable its desired functionality, as indicated by the configuration data provided previously.

Figure 3:
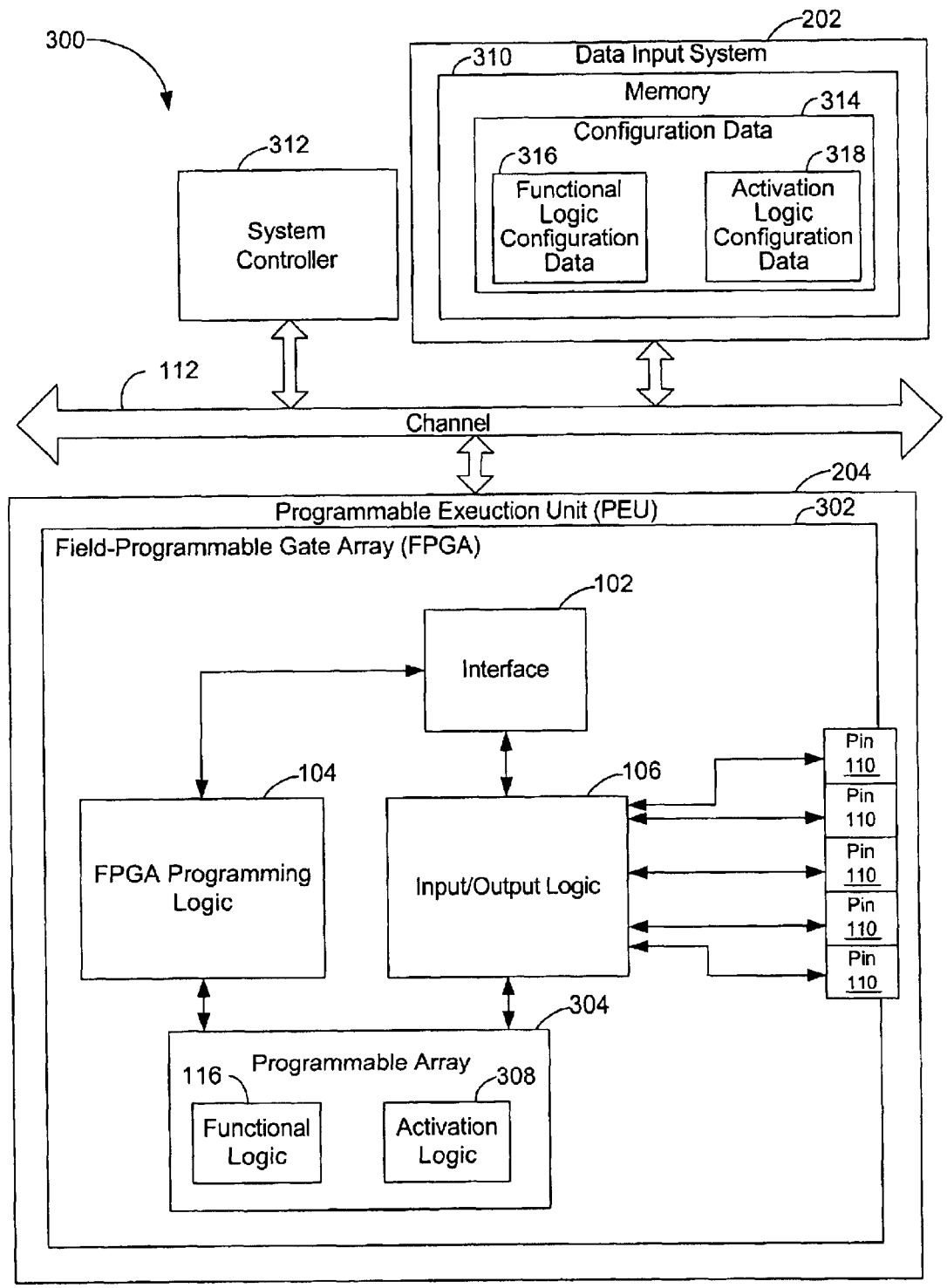
FIG. 3 is a block diagram illustrating an exemplary embodiment of a PEU system, such as depicted in FIG. 2.

FIG. 3 illustrates a PEU system 300 in accordance with an exemplary embodiment of the present invention. The PEU system 300 comprises a PEU 204 having an FPGA 302 that comprises an interface 102, input/output logic 106, FPGA programming logic 104, and a programmable array 304. The programmable array 204 comprises functional logic 116 and activation logic 308.

With respect to the embodiment illustrated in FIG. 3, functional logic 116 and activation logic 308 are implemented in hardware within the programmable array 304 of the FPGA 302. Note that in other embodiments, functional logic 116 and activation logic 308 may be implemented in software or a combination of hardware and software.

As illustrated by the embodiment depicted in FIG. 3, the PEU system 300 generally comprises a data input system 202 having memory 310 that stores the configuration data 314. The PEU system 300 further comprises at least one conventional system controller 312, such as a digital signal processor (DSP) or a central processing unit (CPU), that communicates to and drives the other elements within the PEU system 300 via a channel 112, which can comprise one or more buses.

The configuration data 314 preferably comprises functional logic configuration data 316 and activation logic configuration data 318. The functional logic configuration data 316 preferably comprises information that the FPGA programming logic 104 uses in order to program the functional logic 116 within the programmable array 304 such that the functional logic 116 is configured to perform a desired function(s). Such a desired function may be performed in conjunction with the functionality performed by other electronic components (not shown) of PEU system 300 with which the FPGA 302 communicates, via the 110 logic 106, over channel 112 or pins 110. For example, the configuration data 314, which serves to implement functional logic 116, may be designed to enable the FPGA 302, along with other components (not shown) implemented on a PCB, to perform as a modem PCB designed for a personal computer (PC).

The activation logic configuration data 318 preferably comprises information that the FPGA programming logic 104 uses in order to program the activation logic 308 within the programmable array 304. As will be described in more detail hereafter, the activation logic 308 is preferably configured to activate the functional logic 116 upon receipt of a bit stream representative of an activation key. The activation logic 308 effectively prevents the functional logic 116 from performing its desired function(s), until the activation key is detected by the activation logic 308.

In one embodiment of the FPGA 302, the activation logic 308 may listen to the channel 112 via the interface 102. In this regard, the activation logic 308 may be configured to detect a bit stream from the channel 112 and determine whether the bit stream represents a valid activation key. In determining whether a received bit stream comprises a valid activation key, the activation logic 308 may perform a bitwise comparison of the received bit stream to a series of bits stored in the programmable array 304 that represent a valid activation key. If the bitwise compare indicates that the received bit stream comprises a set of bits corresponding to (e.g., matching) the representation of the valid activation key stored in the array 304, the activation logic 308 preferably enables the functional logic 116.

Alternatively, the activation logic 308 may be configured to cryptographically hash data representative of a valid activation key, which is provided by the activation logic configuration data 318. The activation logic 308 may then store in the programmable array 304 a value indicative of the result of the hashing function performed on the data representative of the valid activation key. The activation logic 308 may then perform the hashing function on a bit stream received via the channel 112 and compare the resulting value with the value stored in the programmable array 304. If the comparison indicates that the values correspond (e.g., match), then the activation logic 308 enables the desired function(s) of the FPGA 302.

Note that, in other embodiments, the activation logic 308 may be configured to listen to a particular pin 110, rather than the channel 112, for a bit stream that may be representative of an activation key. In such an embodiment, the activation logic 308 may perform a bitwise comparison or perform a hashing function comparison in order to determine whether a received bit stream comprises a valid activation key.

Further note that, upon detection of a valid activation key within a received bit stream, the activation logic 308 may enable the functional logic 116 in any number of ways. For example, the functional logic configuration data may be defined such that a component of the functional logic 116 (e.g., an input component, an output component, or a clock) is initially inoperable or otherwise disabled. When the activation logic 308 receives a bit stream that correlates (e.g., matches) with a valid activation key, which may be represented by stored bit data or a hash value, then the activation logic 308 enables the disabled component.

As an example, the functional logic 116 may comprise a switch (not shown) that is initially set to an open state thereby preventing a component of the programmable array 304 from receiving and processing data. When the activation logic 308 detects a valid activation key, the activation logic 308 may be configured to close the switch thereby enabling the foregoing component to receive and process data such that the functional logic 116 can perform its desired function.

With reference to FIG. 3, a bit stream that represents a valid activation key and that enables the FPGA 302 may be transmitted over channel 112 from the system controller 312. Alternatively, memory 310 may comprise PROM that is configured to transmit the configuration data 314 and thereafter transmit a bit stream representative of the activation key.

Note that the activation key may comprise ASCII text that represents a copyright notice or other type of notice pertaining to the configuration data 314 transmitted previously. In such an embodiment, the activation key may additionally serve to provide notice to potential infringers that attempts to collect the configuration data 314 for use in an infringing device are illegal. As an example, the activation key may define an ASCII message indicating that the configuration data 318 is owned by a particular person or persons and/or indicate that the owner reserves its rights in the configuration data 318. For example, the activation key may comprise data defining the following ASCII message, "This logic design is owned by XYZ Corporation, all rights reserved." In another example, the message may include a patent number, a copyright notice, and/or a "patent pending" notice. Moreover, the activation key may serve to place an unintended receiver of the ASCII data on notice that the configuration data 314 is protected by copyright and/or patent rights.

Further note that if the configuration data 314 is siphoned and used for illegally programming an infringing device, the activation key may be used to verify that the infringing device has indeed been illegally programmed with siphoned data. In this regard, a logic analyzer (not shown) might be used in order to retrieve from an alleged infringing device the bit stream that is transmitted over the channel 112 to the FPGA 308. The data obtained from the channel could then be compared to the known activation key. If the activation key is detected within the foregoing bit stream, then it may be concluded that device from which the bit stream was executed is an infringing device.

Figure 4:
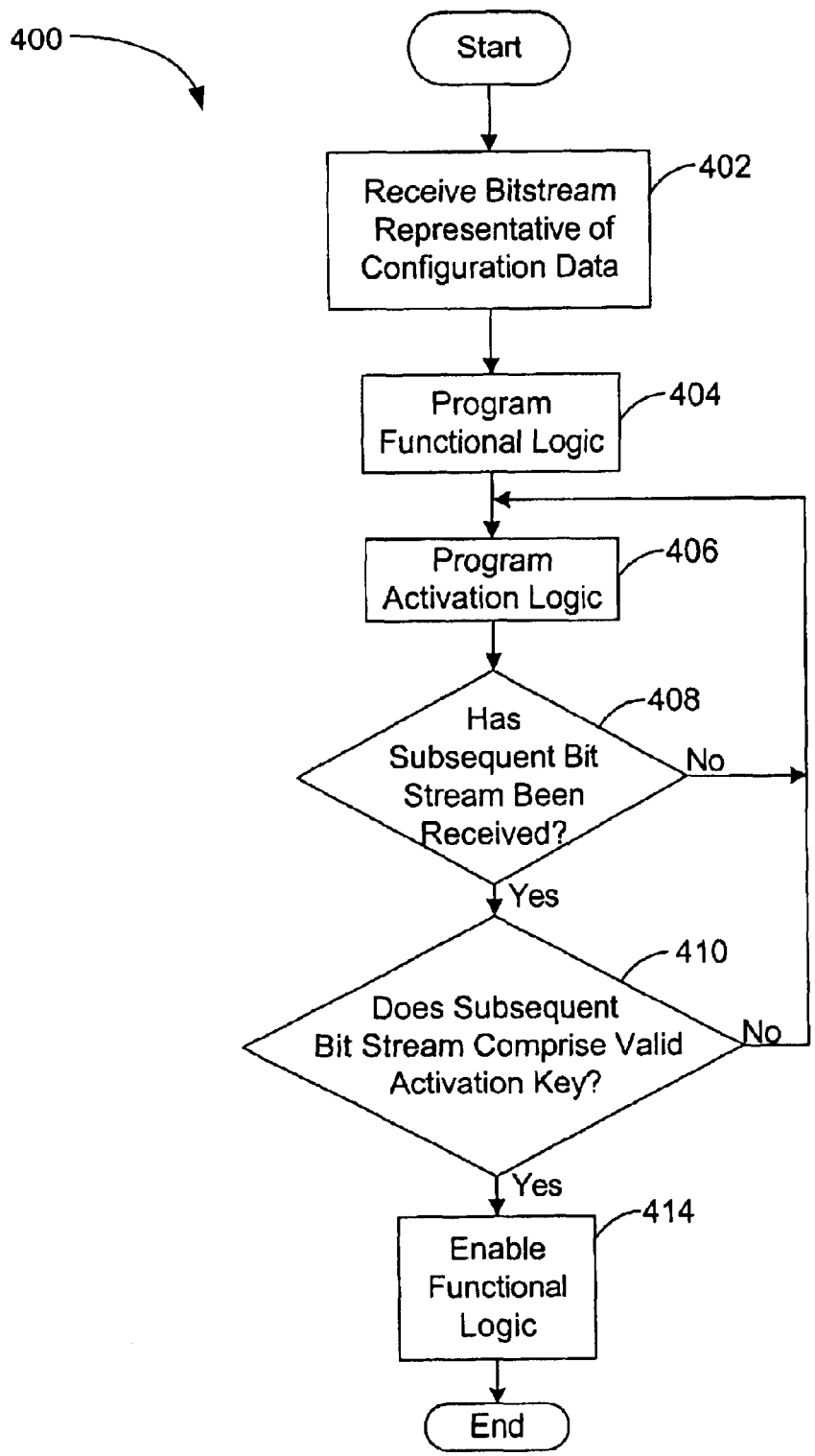
FIG. 4 is a block diagram illustrating an exemplary embodiment of an architecture and functionality of a PEU, such as is depicted in FIG. 3.

An exemplary process 400 for configuring and activating a PEU 204 in accordance with one embodiment of the present invention is described hereafter with reference to FIG. 4. For illustrative purposes, it will be assumed that the PEU 204 comprises an FPGA 302. However, it should be noted that the PEU 204 may comprise other types of arrays in other embodiments.

Initially, FPGA 302 receives a bit stream representative of configuration data 314 that comprises functional logic configuration data 316 and activation logic configuration data 318, as indicated in step 402. The programming logic 104 uses functional logic configuration data 316 to program the functional logic 116 in the programmable array 304, as indicated in step 404, and it uses activation logic configuration data 318 to program the activation logic 308 in the programmable array 304, as indicated in step 406. The programming logic 104 may program the array in steps 404 and 406 by establishing and or removing connections between the logical elements (e.g., logic gates) within the programmable array 404. As an example, the programming logic 104 may control switches and/or blow fuses within the programmable array 304 in order to selectively couple and/or decouple the logical elements within the array 304

Initially, the functional logic 116 is preferably disabled, and can not perform its particular function. The activation logic 308 is configured to monitor an input bit stream for a valid activation key when such a stream is received. Moreover, when an input bit stream is received, the activation logic 308 determines whether the bit stream comprises data defining a valid activation key, as indicated by steps 408 and 410. As noted herein, the input bit stream and, hence, the activation key may be received via the channel 112 or via a pin 110. In addition, the activation logic 308 may validate the received activation key by performing a bitwise comparison or by comparing values indicative of the activation key resulting from a hashing function. Other techniques for validating the activation key are possible in other embodiments.

If a valid activation key is received, then the activation logic 308 enables the functional logic 116 of the FPGA 302 to perform the aforementioned function, as indicated in step 414. As indicated herein, the activation logic 308 may enable the FPGA 302, for example, by enabling an input component, output component, or a clock. Note that, the functional logic 116 remains inactive or disabled until the activation key is received and step 414 is performed.

It should be emphasized that the above-described embodiments of the present invention, particularly, any "preferred" embodiments, are merely possible examples of implementations, merely set forth for a clear understanding of the principles of an embodiment of the invention. Many variations and modifications may be made to the above-described embodiment(s) of the invention without departing substantially from the spirit and principles of the embodiments of the invention. All such modifications and variations are intended to be included herein within the scope of this disclosure and the embodiments of the present invention and protected by the following claims.

Now, therefore, the following is claimed:

1. A system for protecting configuration data of a programmable execution unit, comprising:
   a programmable array; and
   programming logic configured to receive configuration data and to program the programmable array, based on the configuration data, such that the programmable array comprises functional logic and activation logic, the activation logic configured to enable the functional logic upon detection of an activation key.

2. The system of claim 1, wherein a portion of the configuration data comprises data representative of an activation key, the programming logic configured to store the data representative of the activation key in the programmable array.

3. The system of claim 2 wherein the activation logic is further configured to compare a received bit stream to the stored data representative of the activation key, the activation logic further configured to enable the functional logic if a portion of the second bit stream matches the activation key.

4. The system of claim 2 wherein the data representative of the activation key comprises a copyright notice corresponding to the configuration data.

5. The system of claim 1, wherein a portion of the configuration data represents an activation key, the activation logic configured to cryptographically hash the portion into a first hash value and store the first hash value in the programmable array.

6. The system of claim 5, wherein the activation logic is further configured to cryptographically hash a received bit stream into a second hash value, the activation logic further configured to compare the first hash value with the second hash value, the activation logic configured to enable the functional logic if the first hash value substantially corresponds to the second hash value.

7. The system of claim 6, wherein the activation key comprises a copyright notice corresponding to the configuration data.

8. A system for protecting configuration data of a programmable execution unit, comprising:
- a programmable execution unit (PEU) comprising programming logic configured to receive configuration data for programming a programmable array resident on the PEU; and
- a device configured to transmit an activation key to the programmable execution unit, the programmable array configured to enable the PEU in response to the transmitted activation key.

9. The system of claim 8, wherein the configuration data comprises functional logic configuration data and activation logic configuration data, the programming logic configured to program the programmable array with functional logic corresponding to the functional logic configuration data and activation logic corresponding to the activation logic configuration data.

10. The system of claim 9, wherein the activation logic configuration data comprises data representative of a valid activation key, the programming logic further configured to store the data in the array.

11. The system of claim 10, wherein the activation logic is configured to compare the stored data representative of the activation key with the transmitted activation key, the activation logic further configured to enable the PEU if the transmitted activation key and the data representative of the valid activation key are substantially similar.

12. An apparatus for protecting a design of a programmable execution unit (PEU), comprising:
- a storage unit comprising configuration data;
- a channel for transferring the configuration data from the storage unit to the PEU; and
- a system controller configured to transmit an activation key to the PEU.

13. An apparatus as claimed in claim 12, wherein a portion of the configuration data comprises data representative of the activation key.

14. An apparatus as claimed in claim 13, wherein the PEU comprises activation logic configured to store the data representative of the activation key, the activation logic further configured to perform a comparison of the transmitted activation key and the stored data representative of the activation key, the activation logic further configured to enable the PEU if the comparison indicates substantial similarity.

15. A system for protecting configuration data of a programmable execution unit (PEU), comprising:
- means for storing the configuration data;
- means for transmitting the configuration data to the PEU;
- means for programming the PEU in accordance with the configuration data; and
- means for enabling the PEU when the programmable execution unit receives an activation key.

16. A method of protecting configuration data associated with a programmable execution unit (PEU), comprising the steps of:
- transmitting the configuration data from a storage device to the PEU over a channel;
- determining when all the configuration data has been transferred to the PEU; and
- transferring an activation key to the PEU.

17. A method for protecting configuration data of a programmable execution unit (PEU), comprising the steps of:
- receiving configuration data representative of a desired configuration for a PEU;
- programming the PEU based on the configuration data;
- receiving a bit stream;
- monitoring the bit stream for an activation key; and
- enabling the PEU in response to the activation key.

18. The method of claim 17, wherein the configuration data comprises a portion of data representative of an activation key and the programming step further comprises the steps of:
- storing the data representative of the activation key on the PEU.

19. The method of claim 18, wherein the receiving a bit stream step further comprises the step of comparing the bit stream to the stored data representative of the activation key.

20. The method of claim 19, further comprising the step of:
- enabling the execution unit if the bit stream corresponds to the data representative of the activation key.

21. A method for protecting configuration data of a programmable execution unit (PEU), comprising the steps of:
- receiving configuration data;
- programming the PEU, based on the configuration data, such that the programmable array comprises functional logic and activation logic; and
- enabling the functional logic upon detection of an activation key by the activation logic.

* * * * *